United States Patent [19]

Schäfer

[11] 4,092,663
[45] May 30, 1978

[54] SEMICONDUCTOR DEVICE
[75] Inventor: Horst Schäfer, Zirndorf-Nuremberg, Germany
[73] Assignee: Semikron Gesellschaft für Gleichrichterbau und Elektronik m.b.H., Nuremberg, Germany
[21] Appl. No.: 494,856
[22] Filed: Aug. 5, 1974
[30] Foreign Application Priority Data
Aug. 8, 1973 Germany ............................ 2340128
[51] Int. Cl.² ...................... H01L 29/06; H01L 29/74
[52] U.S. Cl. ........................................ 357/55; 357/20; 357/38
[58] Field of Search .................. 357/20, 38, 39, 55
[56] References Cited
U.S. PATENT DOCUMENTS

| 3,370,209 | 2/1968 | Davis et al. | 357/55 |
| 3,437,886 | 4/1969 | Edqvist et al. | 357/55 |
| 3,458,781 | 7/1969 | Simon | 357/38 |
| 3,611,554 | 10/1971 | Garrett | 357/55 |
| 3,697,829 | 10/1972 | Huth et al. | 357/55 |

FOREIGN PATENT DOCUMENTS

| 1,079,261 | 8/1967 | United Kingdom | 357/55 |
| 1,186,620 | 4/1970 | United Kingdom | 357/38 |

Primary Examiner—William D. Larkins
Assistant Examiner—Gene M. Munson
Attorney, Agent, or Firm—Spencer & Kaye

[57] ABSTRACT

An improved semiconductor device with a high blocking capability of the type having a semiconductor wafer with at least two layer type zones of alternatingly opposite conductivity type and different doping concentrations which form a pn junction therebetween which intersects the edge surface of the semiconductor wafer, the higher doped of the at least two zones forming the pn junction being an outer zone of said semiconductor wafer and extending along one of the major surfaces thereof, the edge surface of the semiconductor wafer enclosing, in its path from the higher doped zone to the adjacent lower doped zone, an angle of less than 90° with the surface of the pn junction, and a contact on each of the opposed parallel major surfaces of the wafer. According to the invention, the edge surface of the semiconductor wafer is substantially perpendicular to said major surface of the semiconductor wafer; a recess is formed in said major surface at a predetermined distance from the edge surface and within the higher doped layer, with the edge portion of the recess enclosing an angle equal to or greater than 90° with the region of said major surface disposed between the recess and the edge surface; and the pn junction adjacent the recess extends parallel to the recess.

1 Claim, 7 Drawing Figures

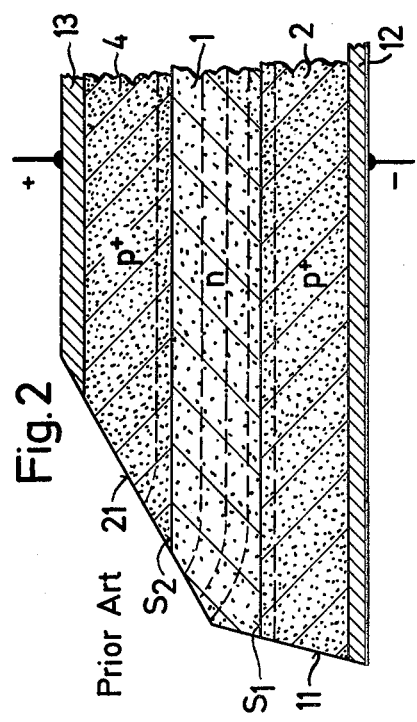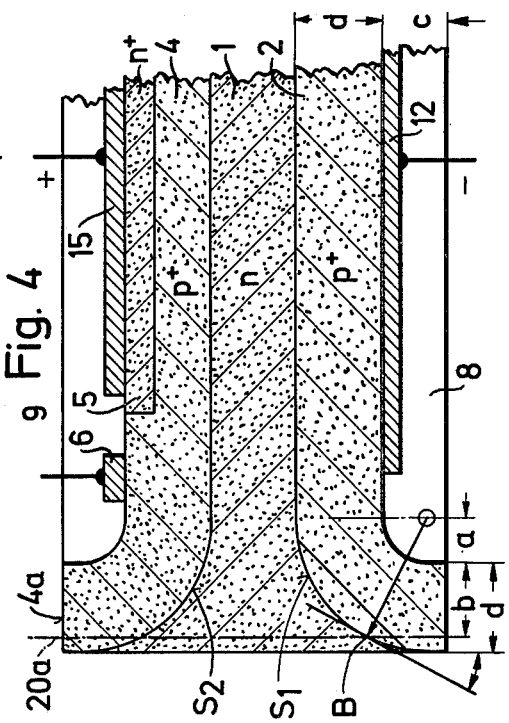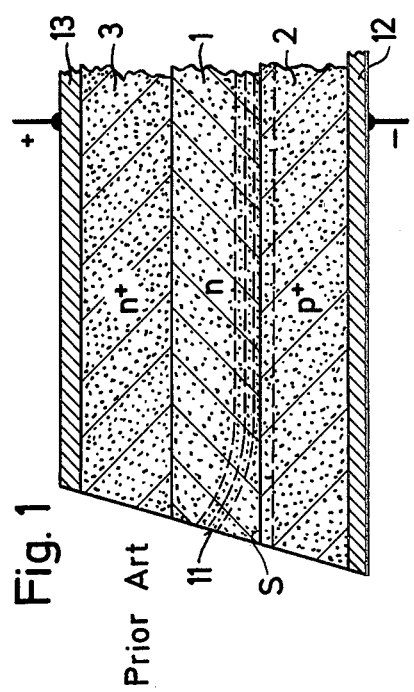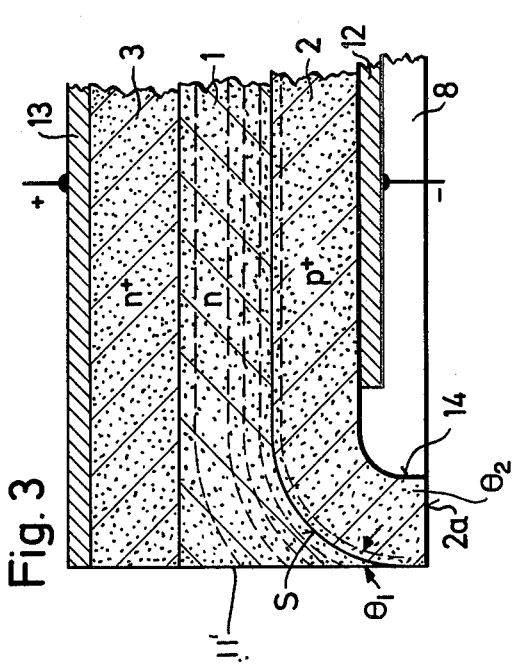

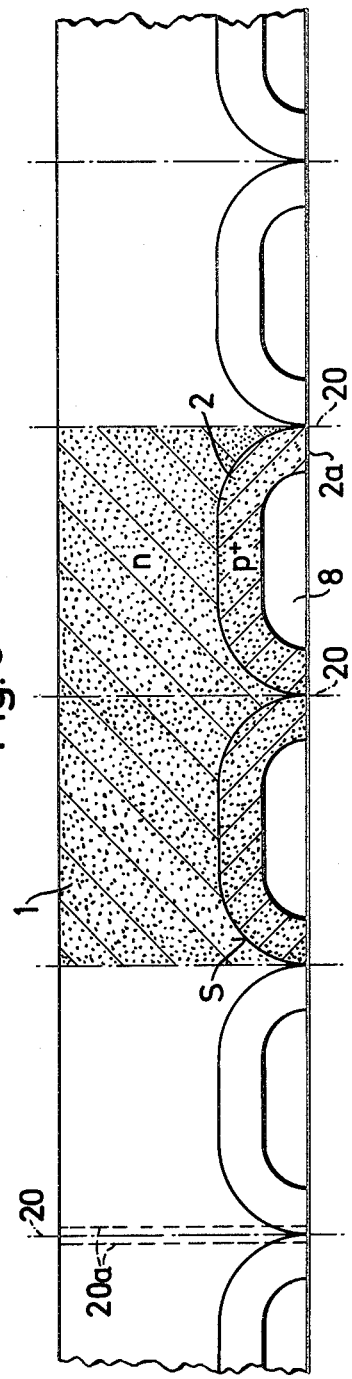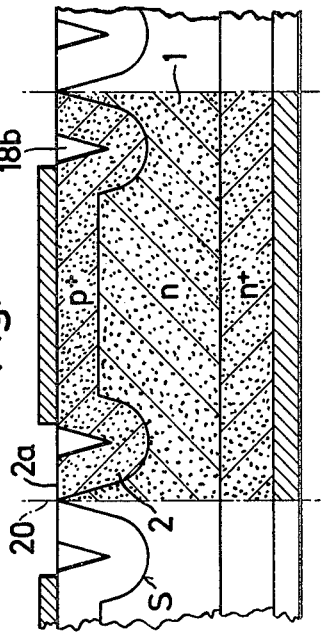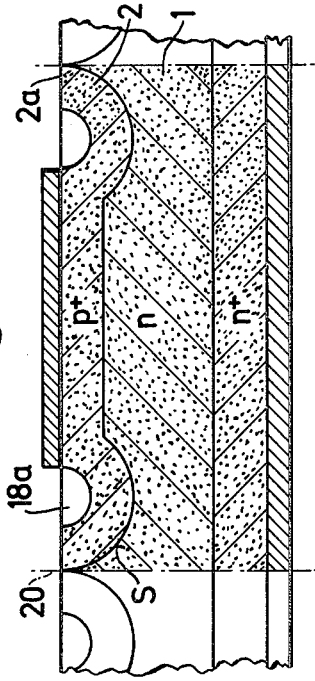

SEMICONDUCTOR DEVICE

BACKGROUND OF THE INVENTION

The present invention relates to a semiconductor device of high blocking capability including a semiconductor body having at least two differently doped layer-type zones of alternatingly opposite conductivity type with a pn junction therebetween, the jacket or edge surface of the semiconductor body enclosing, in its path from the higher doped zone to the lower doped zone, in the region where the pn junction exits, an angle of less than 90° with the pn junction surface.

When semiconductor rectifiers are used, undue excess voltages at the pn junction can produce a so-called field strength breakthrough on the surface of the preferably wafer-shaped semiconductor body which can lead to destruction of the semiconductor device. In order to prevent such an occurrence, and to limit the undue excess voltages by a reversible so-called field strength breakthrough in the volume, it is known to form the semiconductor body with a frustoconical shape by slanting or sloping the edge surface in the vicinity of the pn junction. In this case the normal to the pn junction surface disposed in the region of the exit of the pn junction at the jacket or edge surface of the semiconductor body and pointing in the direction of the lower doped zone forming the pn junction, which lower doped zone lies between higher doped zones, encloses an angle of less than 90° with the normal to the semiconductor body jacket surface at least in the regions over which the barrier layer of the associated pn junction extends.

In view of such a configuration the constant voltage areas extending in the lower doped zone parallel to the pn junction surface have a greater mutual distance in the vicinity of the jacket surface than in the interior of the semiconductor body. Such a configuration is known as a so-called positive slant or slope. A negative slant or slope is given if in the corresponding region the normal to the pn junction surface extending in the direction of the lower doped zone forms an angle greater than 90° with the normal to the jacket surface.

With the appropriate polarization of the voltage across the semiconductor body a positive slant produces a widening of the space charge zone at the jacket surface while a negative slant leads to a constriction or narrowing of the space charge zone and thus to a reduction in the critical surface field intensity.

Semiconductor arrangements are known whose semiconductor bodies are provided with a negative slant in the jacket surface in order to produce a higher blocking capability.

FIG. 1 is a partial sectional view of such a known layer sequence with one pn junction for a rectifier diode. The semiconductor body of the embodiment of FIG. 1 includes a weakly doped center zone 1 of n-type conductivity, a higher doped outer zone 2 of p-type conductivity which forms the pn junction S with zone 1 and an outer zone 3 of n-type conductivity which is opposite p-conductive zone 2. This type of configuration, forming a so-called psn layer sequence, is also provided with electrodes 12 and 13 on the outer surfaces of zones 2 and 3 respectively and is provided, in a known manner, with slanting or sloping jacket surfaces indicated by the reference numberal 11. With the appropriate polarity of the voltage applied thereto the illustrated formation of areas with constant voltage results, particularly in the center zone 1.

It is also known, in a semiconductor body having at least three zones of alternatingly opposite conductivity type, as is the case in thyristors, to provide a positive slant extending to the lower doped center zone in the region of one of the pn junctions and then, beginning in the center zone, to provide an identically directed but substantially less steep further slant in the region of the other pn junction. The second slant is negative but, in view of the very acute angle of preferably 6° to 8° it also results in an expansion of the space charge zone at the jacket surface.

FIG. 2 is a partial sectional view of such a known layer sequence with two pn junctions for a thyristor. The layer sequence shown in FIG. 2 with three zones of alternatingly opposite conductivity type is provided with pn junction $S_1$ and $S_2$ between the high-ohmic n-type conductivity center zone 1 and the two p-type conductivity zones 2 and 4, respectively, which are adjacent each side of the zone 1. The first pn junction $S_1$ opens into the positively slanted region 11, while pn junction $S_2$ opens into the negatively slanted region 21 which begins in the center zone 1.

An extreme drawback of both of these known arrangements is the considerable loss of active area, i.e. the area serving to conduct current through the semiconductor body, particularly in the case of a semiconductor body with a double slant, a so-called double faceting, as shown in FIG. 2. Moreover, the production of the so-called double-faceted design for semiconductor bodies intended for thyristors involves considerable production costs.

SUMMARY OF THE INVENTION

It is the object of the present invention to provide semiconductor bodies for semiconductor device having a high blocking capability in which the mutual spacing of the areas with constant voltage on both sides of the pn junction or junctions is a maximum at the point where the pn junction exits at the edge surface and the loss of effective area is prevented by a special design of the semiconductor body before the pn junction areas are formed.

The above object is achieved according to the present invention in that in a semiconductor device with a high blocking capability of the type comprising a semiconductor wafer with at least two layer type zones of alternatingly opposite conductivity type and different doping concentrations which form a pn junction therebetween which intersects the edge surface of the semiconductor wafer, with the higher doped of the at least two zones forming the pn junction being an outer zone of the semiconductor wafer and extending along one of the major surfaces thereof, with the edge surface of the semiconductor wafer enclosing in its path from the higher doped zone to the adjacent lower doped zone, an angle of less than 90° with the surface of the pn junction and with a contact on each of the opposed parallel major surfaces of the wafer; the edge surface of the semiconductor wafer is substantially perpendicular to said major surface of said semiconductor wafer; a recess is formed in said major surface at a predetermined distance from the edge surface and within the higher doped layer with the edge of said recess enclosing an angle equal to or greater than 90° with the region of said major surface disposed between the recess and the edge surface; and the pn junction adjacent the recess extends parallel to the recess.

According to the method of the invention a recess is formed in the masked major surface of a semiconductor wafer with the edges of the recess enclosing an angle of 90° or greater with the surface, an opposite conductivity type semiconductor region with a higher doping concentration is then formed in the semiconductor body by diffusion from the surface of the recess, and thereafter the wafer is cut perpendicular to the major surface and at a distance of the edge portion of the recess equal to or slightly less than the penetration depth of the diffused region so that the pn junction will intersect the edge surface of the wafer.

BRIEF DESCRIPTION OF THE DRAWINGS

FIGS. 1 and 2 are partial sectional views of a rectifier diode and a thyristor respectively according to the prior art.

FIG. 3 is a partial sectional view of one embodiment of a rectifier diode according to the invention.

FIG. 4 is a partial sectional view of a thyristor according to the invention.

FIG. 5 is a sectional view of a semiconductor wafer illustrating the manner of simultaneously producing a plurality of devices according to the invention.

FIGS. 6 and 7 are sectional views of modifications of the basic device according to the invention.

DETAILED DESCRIPTION OF THE PREFERRED EMBODIMENTS

The present invention will now be explained in detail with embodiments of semiconductor bodies for rectifier devices which are illustrated in section in FIGS. 3 to 6. The same parts bear the same reference numerals in all drawing figures.

Referring now to FIG. 3 where is shown a structure which corresponds to that of FIG. 1 regarding the layer sequence but which in the normal manner has an edge surface 11' which is perpendicular to the major surfaces. According to the present invention, one major surface of the semiconductor body or wafer, and in particular the surface of the outer zone which is adjacent the pn junction, i.e. the p$^+$-conductive zone 2 which is to be contacted, is provided with a planar recess 8, i.e. a recess whose bottom is parallel to the major surface, in the center thereof so that the edge region 2a of zone 2 encloses the recess 8 in a ring where the edge region comes to the surface. On the bottom of recess 8 the layer sequence which is to be contacted with current conducting portions is provided with a contact electrode 12. The width of the edge region 2a with a given penetration depth of zone 2 into the n-conductive semiconductor body is equal to or less than the penetration depth so that the inner diameter of the recess 8 can be easily determined. The depth of recess 8 is not critical and is determined merely by production points of view. The recess 8 may be produced by known removal processes, for example by ultrasonic drilling or grinding.

Corresponding with the configuration of the recess, which is applied before zone 2 is diffused into the semiconductor starting body, the pn junction surface S will form in a suitable manner during the diffusion process for producing zone 2 as defined by the diffusion laws, i.e. it will extend at a distance from the recess 8 which is substantially the same at every point, i.e. the pn junction will be substantially parallel to the shape of the recess 8. In the theoretically most favorable case, i.e. if the edge region 2a of zone 2 has a width at the major surface to be contacted which is equal to the diffusion depth of the zone 2, the tangent to the pn junction surface S at the point of exit of the pn junction encloses an angle of 0° with the edge surface of the wafer. In any case, in order to assure that the pn junction can intersect the edge surface 11' of the semiconductor body or wafer at an acute angle $\theta_1$ in the manner according to the invention, the edge portion 14 of the recess 8 should enclose an angle $\theta_2$ of 90° or greater with the portion of the major surface between the recess and the edge surface of semiconductor body, i.e., the surface of edge region 2a.

FIG. 4 shows a four-layer sequence for a controllable rectifier device with higher doped zones 2 or 4, respectively, at both sides of the lower doped center zone 1 as provided by the present invention. The semiconductor starting body has, at its oppositely disposed major surfaces which are intended for contacting, a recess 8 or 9, respectively. The highly doped emitter zone 5, which is of n$^+$ type conductivity, is inserted, in a conventional manner, into the outer p-type conductivity zone 4 which is called the base zone, the emitter zone 5 is provided with a contact electrode 15. The base zone 4 is further provided with control electrode 6 on the surface thereof and adjacent the emitter zone 5. Also in the region of the edge surface of the semiconductor body or wafer the two p-conductive zones 2 and 4 are also arranged in a mirror image with respect to the central plane of the semiconductor body. The comments made with respect to the configuration of the embodiment of FIG. 3 also apply for the extent of the pn-junctions $S_1$ and $S_2$.

The edge portions of the recesses 8 and 9 may be cylindrical or, as shown in FIG. 4, may be outwardly curved with an increasing inner diameter $a$ with respect to the cylindrical shape. If $a$ is equal to zero, i.e. if the edge portion is cylindrical, the respective pn junction forms, in this sectional view, and in the area next to the section which is parallel to the center plane, a substantially circular arc with a radius equal to the penetration depth $d$ of zone 2 or 4, respectively, and with the center point in the corner of recess 8 or 9, respectively. Otherwise, the comments made in connection with the embodiment of FIG. 3 apply for arrangements having a convex edge region for the recess with regard to the configuration of the pn junction. If the edge portion has a circularly curved first section and adjacent a second section which is perpendicular to the major surface to be contacted, the pn junction will also be perpendicular to this surface in the corresponding section and will substantially coincide with the edge surface of the semiconductor body. In order to assure that the pn junction always exits at the edge surface of the semiconductor body, the width $b$ of the edge regions 2a or 4a, respectively, of zones 2 and 4 as already mentioned must be selected to be equal to or less than the penetration depth $d$ of zones 2 and 4.

With an edge portion curved in a circular arc and with an edge region of the outer zones 2 and 4 having the selected width $b$, the radius of the arc-shaped section of the pn junction area constitutes one side, as the sum of length $a$ and $d$, and its projection on the surface constitutes a further side, as the sum of the paths $a$ and $b$, of a right triangle. This provides the angle of the tangent to the pn junction surface at the point of intersection B of the latter with the intended edge surface 20a of the semiconductor body.

Since the penetration depth $d$ of zone 2 and thus the maximum width of the edge region 2a or 2a, respectively, is given by the requirements for the intended device and can be precisely determined, and since the width b can be selected within a given range, the configuration of the semiconductor body of the present invention permits any desirable shape of the pn junction surface in the vicinity of the jacket or edge surface of the semiconductor body, without slanting or sloping the edge surface, at an acute angle with the edge surface up to approximately the angle 0° and thus the production of rectifier devices in the desired blocking voltage range.

FIG. 5 shows a structure for producing a plurality of rectifier diodes according to the present invention from a large-area, for example n-conductive, semiconductor starting body 1. One major surface of the semiconductor body is provided with recesses 8 according to a desired, for example, raster-shaped pattern, which recesses have a mutual spacing which is determined by the desired width of the edge region 2a for each miniature element. The individual miniature elements, which have an identical np$^+$ layer structure with trough-shaped pn junctions S are then produced by separating the semiconductor body along lines 20, for example by scoring and breaking or with the aid of a grid-shaped sawing device. Lines 20a identify the final cutting edge for dividing the elements, for example by sawing.

In the embodiment shown in FIG. 6, the recess 18a according to the invention, which is provided to produce the desired configuration of the pn junction and thus of the space charge zone is not located in the central region of the major surface but rather in the edge zone of the area(s) of the semiconductor body intended to be contacted. The inner diameter of the semicircular recess 18a, which in itself represents a closed annular recess, can be selected, depending on the areal expanse of the intended layer sequence, for example, between 50 and 500µm. The central surface area of the p-conductive zone 2 which lies, for example, on the same plane as the surface of the edge region 2a, serves to accommodate the contact electrode.

The illustrated embodiment can be used in a corresponding manner for semiconductor bodies with three or more layer-type zones of alternatingly opposite conductivity type and permits a more favorable switch-on behavior for bidirectional thyristors, so-called triacs, particularly when recess 18a is disposed in a mirror image arrangement with respect to the central plane.

FIG. 7 shows a modification of the embodiment of FIG. 6 according to the invention wherein an annular recess 18b with a triangular cross section is provided. With this embodiment, which can be produced preferably by ultrasonic drilling, the loss of active surface area can be reduced even further. The pn junction in this case extends in the last section before exiting to the surface uniformly with a desired angle with the line 20 which coincides approximately with the edge surface of the intended miniature elements so that the exit angle of the pn junction as determined by the shape of the recess remains the same even if a minimum cut thickness is considered for the separating process or if the edge surface of the semiconductor body should have to be additionally removed.

In order to produce the device according to the present invention, for example, a semiconductor body according to FIG. 3, the disc-shaped, for example n-conductive, starting body 1 is pretreated along the side intended for the application of a recess 8 by means of known masking techniques in order to cover at least the edge region 2a with a diffusion masking layer, e.g. SiO$_2$, and is then subjected to a removal process in which the recess 8 is produced by a method known in the art, for example, by ultrasonic drilling or grinding. Thereafter the semiconductor body is provided with layer-type zones of different conductivity type and different doping concentrations in a conventional diffusion process wherein the p-type doping impurity for the outer zone 2 is diffused from the surface of the recess 8. After various known process steps of cleaning and drying electrodes 12 and 13 are applied to the opposed surfaces of the semiconductor body and finally the body is cut at the desired distance from the edge of recess to provide edge surfaces which are perpendicular to the major surface containing the recess 8.

It will be understood that the above description of the present invention is susceptible to various modifications, changes and adaptations, and the same are intended to be comprehended within the meaning and range of equivalents of the appended claims.

I claim:

1. In a semiconductor device with a high blocking capability comprising a semiconductor wafer having at least two layer type zones of alternatingly opposite conductivity type and different doping concentrations and forming a pn junction therebetween which intersects the edge surface of the semiconductor wafer, the higher doped of said at least two zones forming said pn junction being an outer zone of said semiconductor wafer and extending along one of the major surfaces thereof, said edge surface of said semiconductor wafer enclosing, within the lower doped of said at least two zones, an angle of less than 90° with the surface of the pn junction, and a contact on each of the opposed parallel major surfaces of said wafer, the improvement wherein:

said semiconductor wafer is disc shaped;

said edge surface of said semiconductor wafer is substantially perpendicular to said major surfaces of said semiconductor wafer;

a recess is formed in said one major surface at a predetermined distance from said edge surface and within said higher doped zone, the edge portion of said recess enclosing an angle equal to or greater than 90° with the region of said one major surface disposed between said recess and said edge surface;

said recess is in the form of a trough which is closed on itself and is concentric with the enclosed portion of said one major surface;

said pn junction adjacent said recess extends parallel to the surface of said recess; and said contact for said one major surface is disposed on said enclosed portion of said one major surface.

* * * * *